(12) United States Patent
Fujiwara

(10) Patent No.: US 10,338,472 B2
(45) Date of Patent: Jul. 2, 2019

(54) MARK FORMING METHOD AND DEVICE MANUFACTURING METHOD

(71) Applicant: NIKON CORPORATION, Tokyo (JP)

(72) Inventor: Tomoharu Fujiwara, Gyoda (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 15/839,203

(22) Filed: Dec. 12, 2017

(65) Prior Publication Data

US 2018/0102324 A1    Apr. 12, 2018

Related U.S. Application Data

(60) Continuation of application No. 15/394,259, filed on Dec. 29, 2016, now Pat. No. 9,911,701, which is a
(Continued)

(30) Foreign Application Priority Data

Jul. 10, 2012 (JP) .................................. 2012-154372

(51) Int. Cl.
*H01L 21/02* (2006.01)
*H01L 23/544* (2006.01)
(Continued)

(52) U.S. Cl.
CPC .............. *G03F 7/20* (2013.01); *G03F 7/0002* (2013.01); *G03F 7/168* (2013.01);
(Continued)

(58) Field of Classification Search
CPC combination set(s) only.
See application file for complete search history.

(56) References Cited

U.S. PATENT DOCUMENTS

2003/0025890 A1  2/2003  Nishinaga
2007/0242247 A1  10/2007 Shiraishi
(Continued)

FOREIGN PATENT DOCUMENTS

JP  2010-269304 A  12/2010
WO  2011/151109 A1  12/2011

OTHER PUBLICATIONS

Aug. 13, 2013 International Written Opinion issued in International Patent Application No. PCT/JP2013/068751.
(Continued)

*Primary Examiner* — Mamadou L Diallo
(74) *Attorney, Agent, or Firm* — Oliff PLC

(57) ABSTRACT

A mark forming method includes: a step of forming, on a device layer of a wafer, an intermediate layer to which a polymer layer containing a block copolymer is adherable, the device layer including a shot area and a scribe line area; a step of removing a portion, of the intermediate layer, formed in the scribe line area; a step of exposing an image of a mark on the scribe line area and forming, based on the image of the mark, a mark including recessed portion; and a step of applying the polymer layer containing the block copolymer on the device layer of the wafer. When a circuit pattern is formed by using the self-assembly of the block copolymer, it is possible to form the mark simultaneously with the formation of the circuit pattern.

17 Claims, 12 Drawing Sheets

Related U.S. Application Data division of application No. 14/590,488, filed on Jan. 6, 2015, now Pat. No. 9,568,826, which is a continuation of application No. PCT/JP2013/068751, filed on Jul. 9, 2013.

(51) Int. Cl.
| | | |
|---|---|---|
| *G03F 7/20* | (2006.01) | |
| *H01L 21/308* | (2006.01) | |
| *G03F 7/00* | (2006.01) | |
| *G03F 9/00* | (2006.01) | |
| *G03F 7/16* | (2006.01) | |
| *H01L 21/027* | (2006.01) | |
| *B82Y 40/00* | (2011.01) | |

(52) U.S. Cl.
CPC .......... *G03F 7/70341* (2013.01); *G03F 9/708* (2013.01); *H01L 21/0274* (2013.01); *H01L 21/02118* (2013.01); *H01L 21/3086* (2013.01); *H01L 23/544* (2013.01); *B82Y 40/00* (2013.01); *H01L 2223/5446* (2013.01); *H01L 2223/54426* (2013.01); *H01L 2924/0002* (2013.01)

(56) References Cited

U.S. PATENT DOCUMENTS

| | | |
|---|---|---|
| 2010/0297847 A1 | 11/2010 | Cheng et al. |
| 2011/0316021 A1 | 12/2011 | deVilliers et al. |
| 2012/0112370 A1 | 5/2012 | Kobayashi |
| 2013/0207238 A1* | 8/2013 | Cooper .................... G03F 7/004 257/618 |
| 2013/0256265 A1 | 10/2013 | Darling et al. |
| 2014/0022521 A1* | 1/2014 | Harumoto ............... B05C 11/00 355/27 |
| 2014/0087291 A1* | 3/2014 | Taniguchi ................. G03F 1/70 430/5 |
| 2014/0287587 A1 | 9/2014 | Lee et al. |
| 2015/0034594 A1* | 2/2015 | Singh ..................... G03F 7/0002 216/49 |
| 2015/0054055 A1 | 2/2015 | Chen et al. |
| 2015/0064915 A1* | 3/2015 | Wuister ................. G03F 7/0002 438/700 |
| 2015/0243514 A1 | 8/2015 | Ruiz et al. |
| 2015/0303055 A1 | 10/2015 | Xu et al. |

OTHER PUBLICATIONS

Aug. 13, 2013 International Search Report issued in International Patent Application No. PCT/JP2013/068751.
Aug. 13, 2013 International Written Opinion issed in International Patent Application No. PCT/JP2013/068751.
Jan. 5, 2018 Office Action issued in JP Application No. 2017-035847.

\* cited by examiner

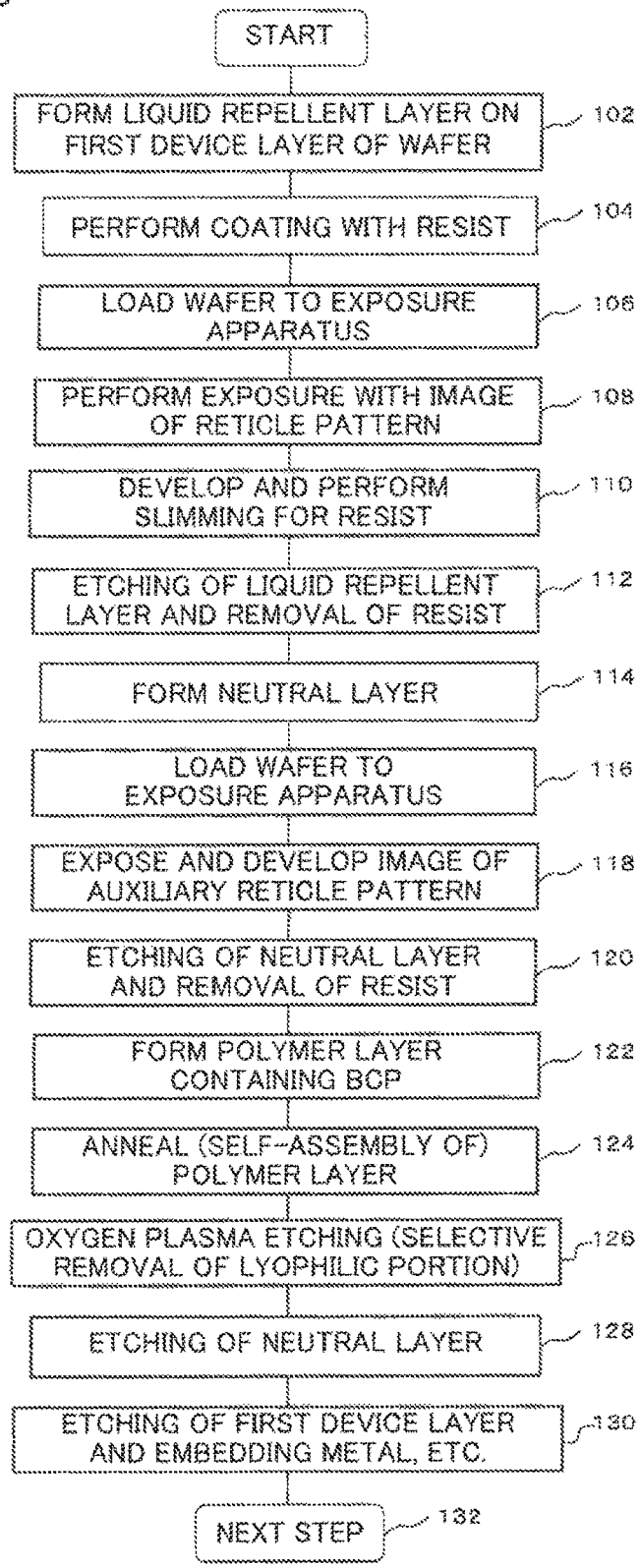

Fig. 12A
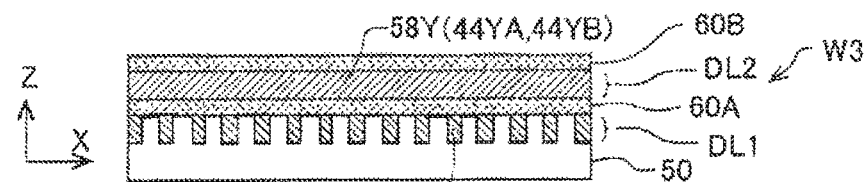
Fig. 12B
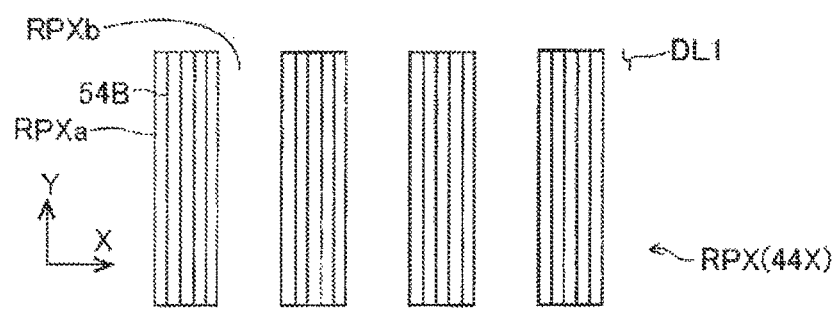
Fig. 12C
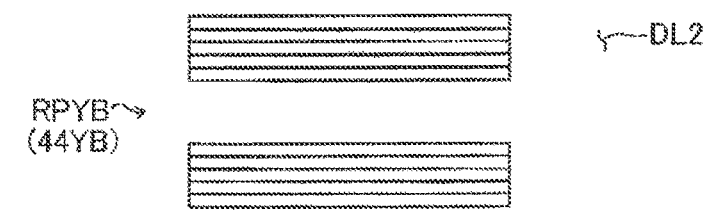
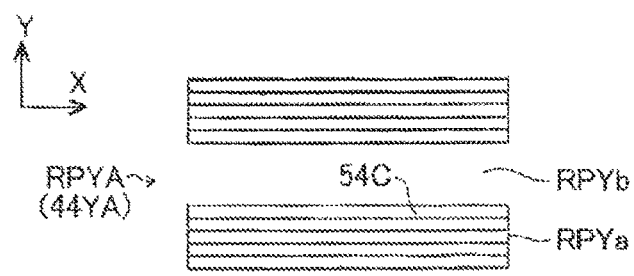

MARK FORMING METHOD AND DEVICE MANUFACTURING METHOD

CROSS REFERENCE TO RELATED APPLICATION

This application is a continuation of application Ser. No. 15/394,259, filed Dec. 29, 2016, which is a divisional of application Ser. No. 14/590,488, filed Jan. 6, 2015, which is a continuation application of International Patent Application No. PCT/JP2013/068751 entitled "MARK FORMATION METHOD AND DEVICE MANUFACTURING METHOD" and claiming the benefit of priority of Japanese Patent Application No. 2012-154372 filed on Jul. 10, 2012. The entire disclosures of the prior applications are hereby incorporated by reference herein their entirety.

TECHNICAL FIELD

The present invention relates to a mark forming method for forming a mark in a mark formation area of a substrate and a method for producing device using the mark forming method.

BACKGROUND ART

A semiconductor device typically includes a plurality of layers of circuit patterns formed on a substrate, and an alignment mark for positioning or alignment is formed in a mark formation area of a predetermined layer of the substrate so as to accurately align the circuit patterns of the plurality of layers relative to each other, in a production step of the semiconductor device. In a case that the substrate is a semiconductor wafer (hereinafter referred to simply as "wafer"), the alignment mark is referred to also as a "wafer mark".

Conventionally, the minutest circuit pattern of the semiconductor device is formed, for example, with a dry or liquid immersion lithography step using a dry or liquid immersion exposure apparatus of which exposure wavelength is 193 nm. It is expected that formation of a circuit pattern more minute, for example, than a 22 nm node is difficult even by combining the conventional photolithography and the double-patterning process which has been recently developed.

In view of this situation, it has been suggested using the directed self-assembly (directed self-organization) of a block copolymer between patterns formed by using the lithography step so as to generate a minute structure of nano-scale (sub-lithography structure), thereby forming a circuit pattern more minute than the resolution limit of the current lithography technique (see, for example, the specification of U.S. Patent Application Publication No. 2010/0297847 or Japanese Patent Application Laid-open No. 2010-269304). The patterned structure of the block copolymer is also known as a micro domain (micro phase-separated domain) or simply as a domain. The graphoepitaxy is known as a method for generating the directed self-assembly.

SUMMARY

It is possible to form a minute circuit pattern of the nano-scale in a certain layer of the substrate by using the directed self-assembly of the block copolymer. In some cases, it is further required to form an alignment mark in the certain layer, together with the circuit pattern. However, in a case that the alignment mark is merely formed with any conventional method, any unexpected minute structure is formed also in the alignment mark itself due to the self-assembly of the block copolymer; in such a case, if the alignment mark is hard to be detected in a step after the formation step, there is a fear that the overlay accuracy between the layers of the substrate might be lowered.

In view of such a situation, a purpose of an aspect of the present teaching is to provide a mark formation technique which is usable when forming a circuit pattern by using the self-assembly of the block copolymer.

According to a first aspect of the present teaching, there is provided a mark forming method including:
forming, on a processing target layer of a substrate, an intermediate layer to which a polymer layer containing a block copolymer is adherable, the processing target layer including a device pattern formation area and a mark formation area;
removing a portion, of the intermediate layer, formed on the mark formation area;
exposing an image of a first mark on the mark formation area, and forming a second mark including recessed portion based on the image of the first mark; and
applying the polymer layer containing the block copolymer on the processing target layer of the substrate.

According to a second aspect of the present teaching, there is provided a mark forming method including:
exposing an image of a first mark on a mark formation layer of a substrate and forming, based on the image of the first mark, a second mark including projected line portion in an area of the substrate;
applying a polymer layer containing a block copolymer on a certain portion of the area of the substrate, the area being an area in which the second mark has been formed, the certain portion being different from the projected line portion;
allowing the polymer layer to form a self-assembly area;
selectively removing the polymer layer from a portion of the self-assembly area; and
processing the mark formation layer of the substrate using the self-assembly area from which the polymer layer has been selectively removed.

According to a third aspect of the present teaching, there is provided a method for producing a device including:
forming, in a substrate, an alignment mark for alignment between layers to be formed on the substrate by using the mark forming method of the first or second aspect of the present teaching;
performing the alignment by using the alignment mark and performing exposure for the substrate; and
processing the exposed substrate.

According to the aspects of the present teaching, it is possible to form a mark together with a circuit pattern when forming the circuit pattern using the self-assembly of the block copolymer.

BRIEF DESCRIPTION OF THE DRAWINGS

FIG. 3 is a flow chart indicating a pattern forming method of a first embodiment.

FIG. 12A is an enlarged cross-sectional view depicting the structure of a plurality of layers of a wafer of a second modification, FIG. 12B is an enlarged plane view depicting a resist mark for a wafer mark of a first device layer of FIG. 12A, and FIG. 12C is an enlarged plane view depicting a resist mark for a wafer mark of a second device layer of FIG. 12A.

EMBODIMENTS

First Embodiment

A preferred first embodiment of the present teaching will be explained with reference to FIGS. 1A to 5B. At first, an explanation will be given about an example of a pattern forming system usable for forming a circuit pattern of an electronic device (micro device) such as a semiconductor element, etc., in the embodiment.

Figure 1A:
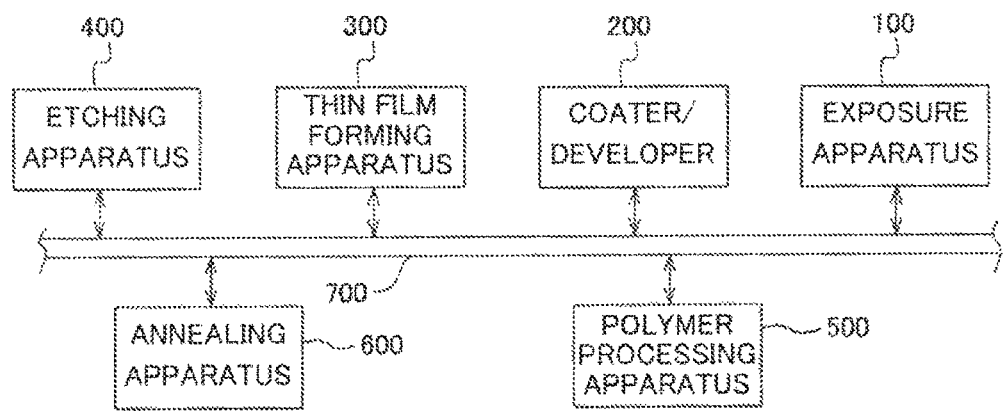
FIG. 1A is a block diagram depicting main parts or portions of a pattern forming system used in embodiments of the present teaching.
Figure 1B:
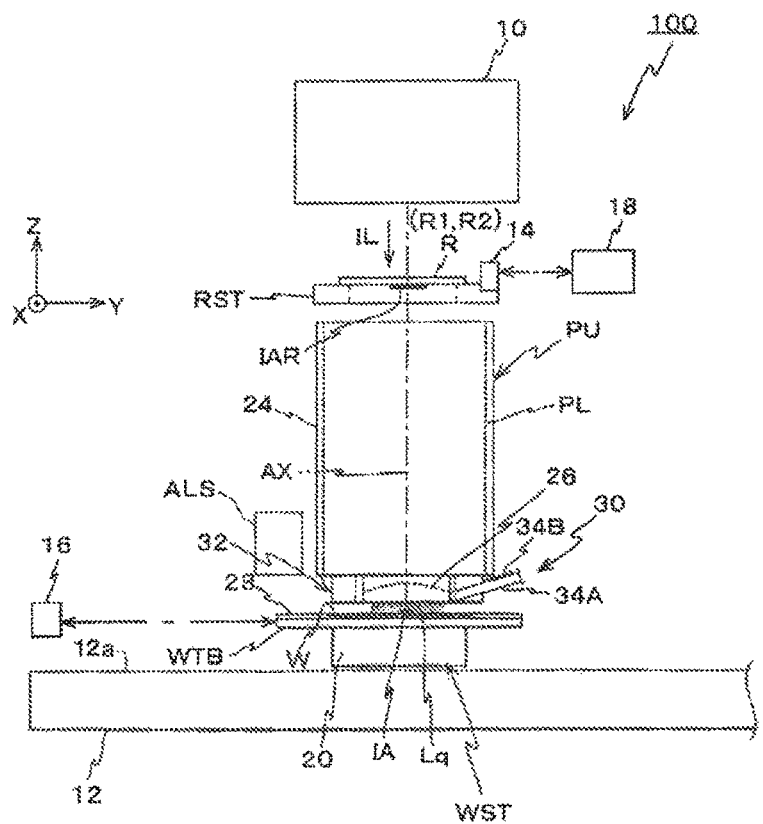
FIG. 1B is a diagram depicting the overall configuration of an exposure apparatus 100 depicted in FIG. 1A.

FIG. 1A depicts the main parts or portions of the pattern forming system of the embodiment, and FIG. 1B depicts the overall configuration of an exposure apparatus 100 depicted in FIG. 1A and which is an exposure apparatus (projection exposure apparatus) of the scanning exposure type constructed of a scanning stepper (scanner). In FIG. 1A, the pattern forming system includes the exposure apparatus 100, a coater/developer 200 which performs coating or application of a photoresist (resist) as a photosensitive material for a wafer (substrate) and which performs the development of the coated (applied) photoresist, a thin film forming apparatus 300, an etching apparatus 400 which performs the dry etching and the wet etching for the wafer, a polymer processing apparatus 500 which performs processing of a polymer containing a block copolymer (BPC) to be described later on, an annealing apparatus 600, a transport system 700 which performs the transport of the wafer among the apparatuses, a host computer (not depicted in the drawings), and the like.

The block copolymer used in the present teaching is a polymer including not less than two monomers each of which is present as a block, or a polymer derived from these monomers. Each of the blocks of the monomers includes a repeated sequence of the monomers. As the block copolymer, it is allowable to use any polymer such as diblock copolymer, triblock copolymer, or the like. Among these copolymers, the diblock copolymer has blocks of two different monomers. The diblock copolymer can be abbreviated, for example, as "A-b-B", wherein "A" represents a polymer of a first block, "B" represents a polymer of a second block, and "-b-" indicates that it is a diblock copolymer having the A block and the B block. For example, "PS-b-PMMA" represents a diblock copolymer of polystyrene (PS) and polymethyl methacrylate (PMMA). In addition to a chain block copolymer, it is allowable to use block copolymers having other structures including, for example, a star copolymer, a branched copolymer, a hyper-branched copolymer, or graft copolymer, etc., as the block copolymer of the present teaching.

Further, the block copolymer has such a tendency that the respective blocks (monomers) constructing the block copolymer assemble together to form individual micro phase-separated domains referred to also as "micro domains" or simply as "domains" (tendency to undergo phase separation). The phase separation is a kind of the self-assembly (self-organization). The spacing distance between different domains and the form of the domains depend on the interaction between the different blocks in the block copolymer, the volume fraction and number of the different blocks. The domains of the block copolymer can be formed, for example, as a result of annealing. The heating or baking which is a part of the annealing is a general process in which the temperatures of a substrate and of a coating layer (thin film layer) provided on the substrate is raised higher than the ambient temperature. The annealing can include thermal annealing, thermal gradient annealing, solvent vapor annealing or other annealing methods. The thermal annealing is referred to as heat curing (thermal curing) in some cases, and used to induce the phase separation. The thermal annealing can be used also as a process for reducing or removing any defect inside a layer of lateral micro phase-separated domains. The annealing generally includes heating of the substrate etc. at a temperature higher than the glass-transition temperature of the block copolymer for a certain period of time (for example, several minutes to several days).

Further, in the embodiment, the directed self-assembly (DSA) is applied to a polymer containing a block copolymer so as to allow the polymer containing the block copolymer to form domains of nano-scale order which are segmented in a suitable shape for the formation of a circuit pattern and/or an alignment mark of a semiconductor device. The directed self-assembly is a technique in which a pattern of resist (resist pattern) formed, for example, in a lithography step is used as a pre-pattern or guide pattern, and the arrangement of domains of the block copolymer is controlled based on a spatial arrangement (topographic structure) defined by the pre-pattern or guide pattern. As a method of generating or causing the directed self-assembly, it is possible to use, for example, the chemo-epitaxy process wherein a planar pre-pattern or guide pattern is provided on a base layer. However, it is also possible to use the grapho-epitaxy process which uses a three-dimensional pre-pattern or guide pattern.

In FIG. 1B, the exposure apparatus 100 is provided with an illumination system 10; a reticle stage RST which holds a reticle R (mask) illuminated with illumination light or illumination light beam for the exposure (exposure light) IL from the illumination system 10; a projection unit PU including a projection optical system PL which projects the illumination light IL allowed to exit (exiting) from the reticle R onto a surface of a wafer W (substrate); a wafer stage WST which holds the wafer W; and a main controller (not depicted in the drawings) constructed of a computer controlling the entire operations of the exposure apparatus. In the following, an explanation will be given with the Z-axis being taken in parallel to an optical axis AX of the projection optical system PL, the Y axis being taken along a direction in which the reticle R and the wafer W are scanned relative to each other in a plane perpendicular to the Z axis (plane substantially parallel to a horizontal plane), the X-axis being taken along a direction orthogonal to the Z-axis and the Y-axis, and directions of rotation (inclination) about the X axis, the Y axis, and the Z axis being designated as θx, θy, and θz directions respectively, in FIG. 1B.

The illumination system 10 includes, as disclosed for example in the specification of United States Patent Application Publication No. US 2003/025890, etc., a light source which generates the illumination light IL and an illumination optical system which illuminates the reticle R with the illumination light IL. As an example, the ArF excimer laser beam (wavelength: 193 nm) is used as the illumination light IL. It is also possible to use, as the illumination light IL, the KrF excimer laser beam (wavelength: 248 nm), the high harmonic wave such as the YAG laser or the solid-state laser (for example, the semiconductor laser), etc.

The illumination optical system includes: a polarization controlling optical system; a light amount distribution forming optical system (a diffraction optical element or a spatial light modulator, etc.); an illuminance uniformizing optical system including an optical integrator (such as fly-eye lens or rod integrator (inner-reflection integrator)), etc.; a reticle blind (a fixed or variable field stop) (all of the above are not depicted in the drawings); and the like. The illumination system 10 illuminates a slit-shaped illumination area IAR which is defined by the reticle blind on a pattern surface (lower surface) of the reticle R, and which is elongated in the X direction, with the illumination light IL in a predetermined polarization state at a substantially uniform illuminance distribution, under an illumination condition such as the dipole illumination (including a so-called leaf illumination in which the shape of a secondary light source is elongated in a leaf-like shape in a non-periodic direction of the pattern), quadrupole illumination, annular (zonal) illumination, or a normal illumination, etc.

The reticle stage RST holds (retains) the reticle R thereon by the vacuum attraction etc. The reticle stage RST is placed on the upper surface of an unillustrated reticle base (surface parallel to the XY plane) so that the reticle stage RST is movable in Y direction at a constant speed and the positions of the reticle stage RST in the X and Y directions and the rotational angle of the reticle stage RST in the θz direction are adjustable. The position information of the reticle stage RST is always detected at a resolution of, for example, about 0.5 nm to about 0.1 nm via a movement mirror 14 (or a mirror-finished side surface of the stage) by a reticle interferometer 18 including a multi-axis laser interferometer. A reticle stage driving system (not depicted in the drawings) including a linear motor, etc. is controlled based on a measured value by the reticle interferometer 18, to thereby control the position and the velocity of the reticle stage RST.

Further, the projection unit PU arranged at a position below or under the reticle stage RST is provided with a barrel 24, and the projection optical system PL including a plurality of optical elements which are held in a predetermined positional relationship inside the barrel 24. The projection optical system PL is, for example, telecentric on the both sides and has a predetermined projection magnification β (for example, reduction magnification such as ¼, ⅕, etc.). An image of the circuit pattern in the illumination area IAR of the reticle R is formed, via the projection optical system PL, in an exposure area IA (area conjugated with the illumination area IAR) inside one shot area among the shot areas of the wafer W by the illumination light IL allowed to pass through the reticle R. The wafer W (semiconductor wafer) as the substrate in the embodiment includes, for example, a substrate constructed of a disk-shaped base member having a diameter in a range of about 200 mm to about 450 mm and composed of, for example, silicon or SOI (silicon on insulator) etc., wherein a thin film for pattern formation (oxide film, metal film, polysilicon film, etc.) is formed on a surface of the base member. Further, a photoresist is applied (coated) on a surface of the wafer w as an object to be exposed (exposure target) to provide a predetermined thickness (for example, about several tens of nm to about 200 nm).

Furthermore, for the purpose of performing the exposure to which the liquid immersion method is applied, the exposure apparatus 100 is provided with a nozzle unit 32. The nozzle unit 32 constructs a part or portion of a local liquid immersion device 30 for supplying a liquid Lq between the end-portion lens 26 and the wafer W. The nozzle unit 32 is provided such that an lower end portion of the barrel 24 is surrounded by the nozzle unit 32, the barrel 24 holding an end-portion lens 26 which is included in the plurality of optical elements constructing the projection optical system PL and which is an optical element closest to the image plane side (closest to the wafer W side). A supply port for the liquid Lq of the nozzle unit 32 is connected to a liquid supply device (not depicted) via a supply flow passage and a supply tube 34A. A recovery port for the liquid Lq of the nozzle unit 32 is connected to a liquid recovery device (not depicted) via a recovery flow passage and a recovery tube 34B. The detailed configuration of the local liquid immersion device 30 is disclosed, for example, in the specification of United States Patent Application Publication No. US 2007/242247, etc.

Moreover, the wafer stage WST is placed on an upper surface 12a, of a base plate 12, which is parallel to the XY plane such that the wafer stage WST is movable in the X and Y directions. The wafer stage WST includes a body 20 of the wafer stage (stage body 20); a wafer table WTB arranged on the upper surface of the stage body 20; and a Z-leveling mechanism (not depicted in the drawing) which is provided inside the stage body 20 and which drives the wafer table WTB such that the position in the Z direction (Z position) and the tilt angles in the θx and θy directions of the wafer table WTB (wafer W) relative to the stage body 20 are changed. A wafer holder (not depicted), which holds the wafer W for example by the vacuum attraction, etc. on a suction surface approximately parallel to the XY plane, is provided on the wafer table WTB. A flat-shaped plate (liquid-repellent plate) 28, having a surface which is subjected to the liquid-repellent treatment for the liquid Lq, is provided on a portion of the upper surface of the wafer table WTB, the portion surrounding the wafer holder (wafer W); the surface of the liquid-repellent plate 28 is provided to be approximately flush with the surface of the wafer W (wafer surface) placed on the wafer holder. Further, the Z-levelling mechanism of the wafer stage WST is driven based on a measured value by, for example, an autofocus sensor of the oblique incident system (not depicted in the drawings) so that the wafer surface is matched (focused on) the image plane of the projection optical system PL during the exposure.

Furthermore, reflection surfaces are formed by performing mirror-finish for end surfaces in the Y and X directions of the wafer table WTB, respectively. The position information (including at least the positions in the X and Y directions and the rotational angle in the θz direction) of the wafer stage WST is measured at a resolution of, for example, about 0.5 nm to about 0.1 nm by projecting interferometer beams to the reflection surfaces, respectively (may be to a movement mirror) from a multi-axis laser interferometer constructing a wafer interferometer 16. A wafer stage driving system including a linear motor, etc. (not depicted in the drawings) is controlled based on a measured value of the measurement, to thereby control the position and the velocity of the wafer stage WST. Note that the position information of the wafer stage WST may be measured with a detection device of an encoder system provided with a scale of diffraction grating type and a detection head.

Moreover, the exposure apparatus 100 is provided with a wafer alignment system ALS which measures the position of a predetermined wafer mark (alignment mark) of the wafer W, and a spatial image measuring system (not depicted in the drawings) which is contained in the wafer stage WST in order to measure the position of an image of an alignment mark of the reticle R formed by the projection optical system PL. The alignment is performed for the reticle R and the respective shot areas of the wafer W by using the spatial image measuring system (reticle alignment system) and the wafer alignment system ALS.

When performing exposure of the wafer W, a shot area of the wafer W as the exposure target is moved to be positioned beside the exposure area IA by the movement (step movement) of the wafer stage WST in the X direction and the Y direction. Further, the liquid Lq is supplied from the local liquid immersion device 30 to a space between the projection optical system PL and the wafer W. An image of a part of the pattern of the reticle R, which is formed by the projection optical system PL, is projected onto a certain shot area among the shot areas of the wafer W, while the reticle R and the wafer W are moved synchronously in the Y direction via the reticle stage RST and the wafer stage WST. By doing so, the certain shot area is subjected to the scanning exposure with the image of the pattern of the reticle R. The step movement and the scanning exposure are repeated, and thus each of the shot areas of the wafer W is exposed with the image of the pattern of the reticle R in the step-and-scan manner and the liquid immersion manner.

Next, a pattern for device (device pattern) as an object to be produced (production target) in the embodiment is, as an example, a circuit pattern for a gate cell of a static RAM (SRAM) as a semiconductor element. The circuit pattern is formed by using the directed self-assembly (DSA) of a polymer containing a block copolymer. Further, in the embodiment, a wafer mark as an alignment mark for positioning or alignment is also formed in a device layer of a wafer W in which the device pattern is formed.

Figure 2A:
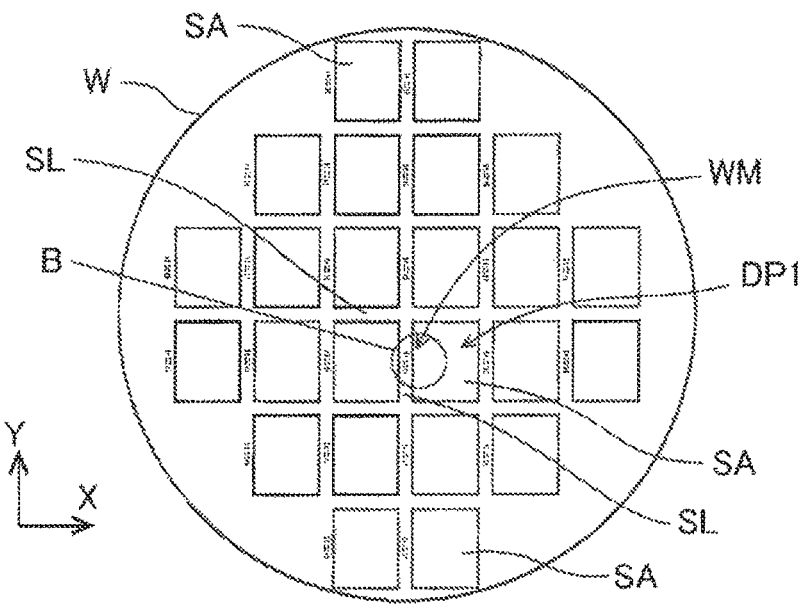
FIG. 2A is a plane view depicting a certain device layer of a wafer of a first embodiment.

FIG. 2A depicts a wafer W in which the device pattern and the wafer mark are formed. In FIG. 2A, a large number of shot areas SA (device pattern formation areas) are provided on the surface of the wafer W in a state that scribe line areas SL (mark formation areas) having predetermined widths are intervened between the shot areas SA in the X and Y directions; a device pattern DP1 is formed inside each of the shot areas SA, and a wafer mark WM is formed in each of the scribe line areas SL provided adjacent to one of the shot areas SA.

Figure 2B:
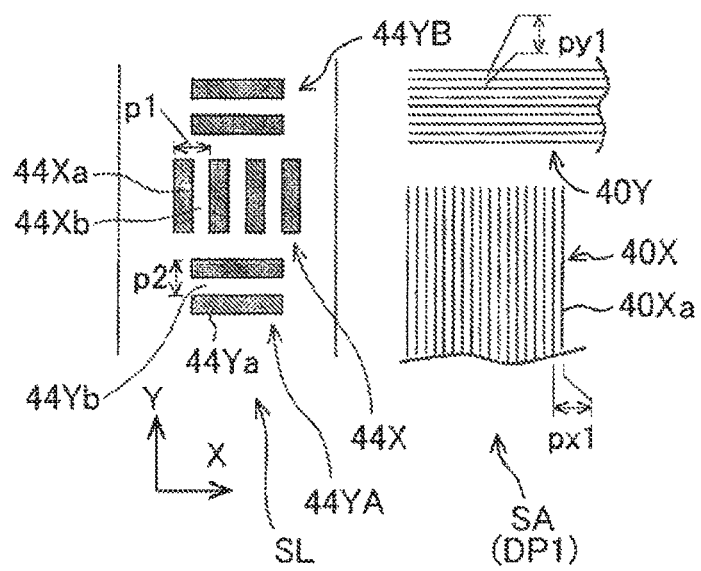
FIG. 2B is an enlarged plane view depicting one of wafer marks and a part of a circuit pattern of FIG. 2A.

As depicted in FIG. 2B which is an enlarged view of portion B in FIG. 2A, the device pattern DP1 includes a line-and-space pattern (hereinafter referred to as "L & S pattern") 40X in which a plurality of line patterns 40Xa extending in the Y direction are arranged in the X direction substantially at a period (pitch) px1 and a L & S pattern 40Y in which a plurality of line patterns extending in the X direction are arranged in the Y direction substantially at a period py1. The line pattern 40Xa, etc., are each formed, for example, of a metal, and the line width thereof is about not more than ½ times (half) the period px1, etc. As an example, the period px1 is substantially same as the period py1, and the period px1, etc., are each about one severalth of the minutest period (hereinafter referred to as "period pmin") which can be obtained in a process in which the liquid immersion lithography using a wavelength of 193 nm and, for example, a so-called double patterning process are combined. The value half (the value ½ times) the period px1 is smaller than, for example, about 22 nm. In a case of forming the L & S patterns 40X and 40Y having such a minute period, a linear domain is formed by each of different blocks when the polymer containing the block copolymer is allowed to undergo the directed self-assembly.

Further, the wafer mark WM in each of the scribe line areas SL includes a X-axis wafer mark 44X in which a recessed area 44Xa and a projected area 44Xb each elongated in the Y direction and having substantially same widths in the X direction are arranged in the X direction at a period p1, and Y-axis wafer marks 44YA, 44YB which are disposed on two locations, and in each of which a recessed area 44Ya and a projected area 44Yb each elongated in the X direction and having substantially same widths in the Y direction are arranged in the Y direction at a period p2. In the embodiment, each of the recessed areas 44Xa and 44Ya has, for example, a metal thin film embedded therein, and the heights of the projected areas 44Xb and 44Yb are same as the height of portions surrounding the recessed areas 44Xa and 44Ya. In this case, when the recessed areas 44Xa and 44Ya are regarded as line portions and the projected areas 44Xb and 44Yb are regarded as space portions, the wafer marks 44X, 44YA and 44YB can be regarded as L & S patterns. The wafer marks 44YA and 44YB are arranged to sandwich the wafer mark 44X therebetween in the Y direction. As an example, the periods p1 and p2 are identical, and the period p1 is several times to several ten times the resolution limit (period) in the liquid immersion lithography using the wavelength of 193 nm.

Further, it is enough if the recessed areas 44Xa, 44Ya and the projected areas 44Xb, 44Yb are areas different in the reflectivity with respect to a detection light in case of performing detection with the wafer alignment system ALS depicted in FIG. 1B. In a case that the metal is embedded in the recessed areas 44Xa and 44Ya, the recessed areas 44Xa, 44Ya have a reflectivity different from that of the projected areas 44Xb, 44Yb which are, for example, non-conductive, and thus the detection can be easily performed by the wafer alignment system ALS. In the embodiment, the directed self-assembly is applied during the formation of the device pattern DP1 whereby the linear domains are formed. However, regarding the formation of the wafer mark 44X, etc., the domain formation is prevented in the following manner.

Figure 4A:
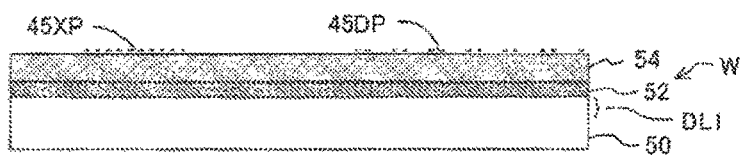
FIGS. 4A, 4B, 4C, 4D, 4E, 4F and 4G are enlarged cross-sectional views each depicting a portion of a pattern of a wafer gradually changing during a pattern forming step.
Figure 4B:
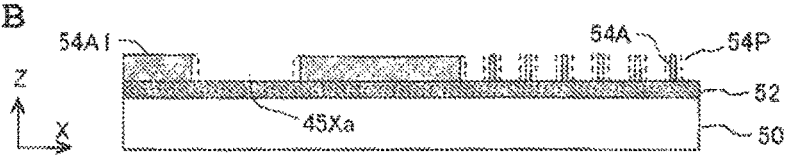

In the following, an explanation will be given about an example of a pattern forming method for forming the wafer mark 44X, etc., depicted in FIG. 2B by using the pattern forming system of the embodiment, with reference to a flow chart indicated in FIG. 3. Note that the device pattern DP1 is also formed together with the wafer mark 44X, etc. As an example, as depicted in FIG. 4A, a surface portion of a base member 50, of the wafer W, formed for example of silicon is a first device layer DL1 in which the wafer mark and device pattern are to be formed.

At first, in Step 102 of FIG. 3, the thin film forming apparatus 300 is used to form a liquid-repellent layer 52 with a material easily repelling a liquid (for example, water) on a surface of the device layer DL1 of the wafer W. As the material for the liquid-repellent layer 52, for example, polystyrene (PS) is used. Further, the coater/developer 200 is used so as to perform coating on the liquid-repellent layer 52 with, for example, a positive resist layer 54, as depicted in FIG. 4A (Step 104). Further, the illumination condition of the exposure apparatus 100 is set, for example, to the quadrupole illumination so that the minutest pattern can be exposed in the X and Y directions, and the wafer W is loaded onto the exposure apparatus 100 (Step 106). Then, each of the shot areas SA of the wafer W is exposed with an image 45DP of the device pattern (device pattern image 45DP) of the reticle R by the liquid immersion method. At the same time as the exposure is performed for each of the shot areas SA, the scribe line area SL provided adjacent to each of the shot areas SA is exposed with an image 45XP, etc. of the pattern of the wafer mark (wafer mark pattern image 45XP, etc.) of the reticle R (Step 108). The wafer for which the exposure has been performed is unloaded from the exposure apparatus 100, and the resist is developed at the coater/developer 200 so as to form a resist pattern 54P (see FIG. 4B) thereon. Afterwards, the slimming and resist curing processing are performed for the resist pattern 54P (Step 110). In the resist layer, a plurality of guide patterns 54A, etc. of which line width in the X direction is narrow are formed from the device pattern image, and an opening 45Xa, etc., in a resist film 54A1 are formed from the wafer mark pattern image. Note that during the exposure of the pattern image of the reticle R, it is also possible to adjust the exposure amount to be great so that the line width of the resist pattern becomes narrow. In such a case, the slimming can be omitted. Note that since the line width of the wafer mark pattern image is great, the change in the line width brought about by the slimming is small.

Figure 4C:
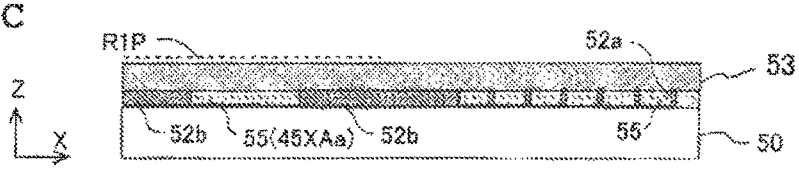
Figure 4D:
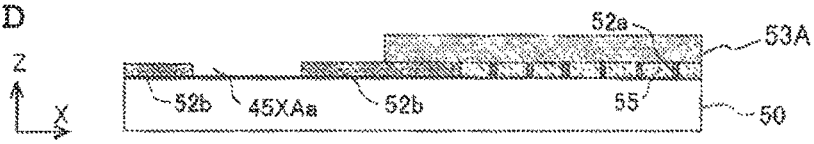
Figure 4E:
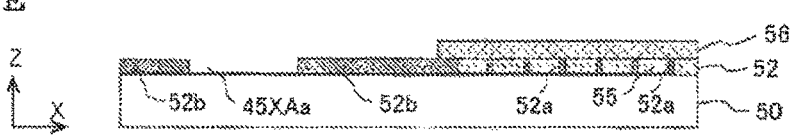
Figure 5A:
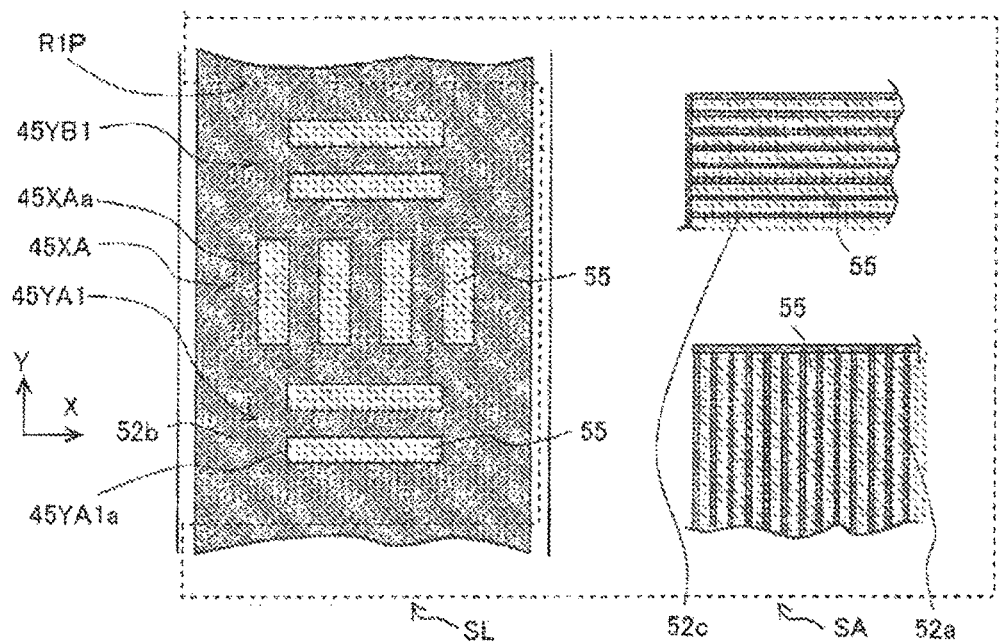
FIG. 5A is an enlarged plane view depicting a portion of a surface of the wafer which has been coated with a neutral layer.

Further, the wafer W is transported to the etching apparatus 400 so as to perform etching of the liquid-repellent layer 52 with the resist pattern as the mask, and then the resist is peeled off (removed) (Step 112). By doing so, as depicted in FIGS. 4C and 5A, a plurality of linear guide patterns 52a and 52c which have shapes same as those of the plurality of guide patterns 54A, etc. of the resist and which extend in the Y and X directions, respectively, are formed in the liquid-repellent layer 52 of the shot area SA; and an X-axis mark portion 45XA constructed of a plurality of openings 45XAa which are arranged in the X direction and Y-axis mark portions 45YA1, 45YB1 constructed of a plurality of openings 45YA1a, etc. which are arranged in the Y direction are formed in the liquid-repellent layer 52 in the scribe line area SL corresponding to the wafer mark pattern image, while having a remaining-film portion 52b as a background thereof. Further, the wafer W is transported to the thin film forming apparatus 300 and a neutral layer 55 is formed on the surface of the wafer W using a material having a property between the lyophilic property and the liquid-repellent property by, for example, the spin coating (Step 114). The neutral layer 55 is deposited (stacked) in the recessed portions between the plurality of guide patterns 52a and the plurality of guide patterns 52c in the liquid-repellent layer 52 and in the openings 45XAa, 45YA1a that are the recessed portions inside the mark portion 45XA and the mark portions 45YA1 and 45YB1.

Figure 5B:
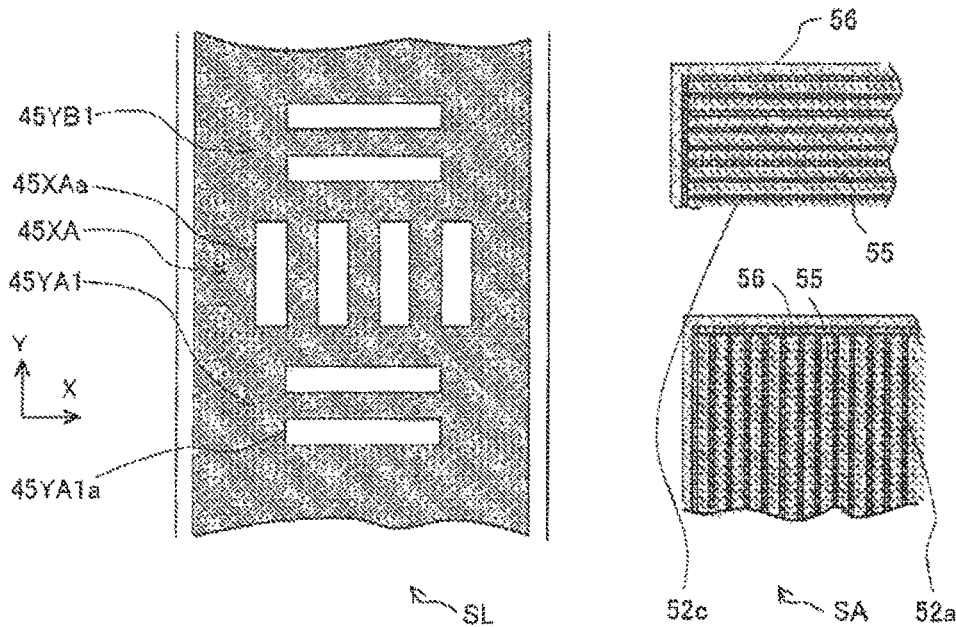
FIG. 5B is an enlarged plane view depicting the portion of the surface of the wafer in a state that a portion of the neutral layer has been removed.

Then, after performing coating with, for example, a positive resist layer 53 so as to cover the neutral layer 55 of the wafer W, the wafer W is loaded onto the exposure apparatus 100 (Step 116). Then, each of the shot areas SA of the wafer is exposed with an image R1P of the pattern of an auxiliary reticle R1 (auxiliary reticle pattern image R1P) (see FIG. 4C), and the resist layer 53 is developed (Step 118). In the exposure of this step, any high resolution is not required. Thus, exposure apparatus having a low resolution and different from the exposure apparatus 100 may be used. As depicted in FIG. 5A, the image R1P has a large light amount in a certain area, of the scribe line SL, including the mark portions 45XA, 45YA1 and 45YB1 but has substantially 0 (zero) light amount in other area (shot area SA) that is different from the certain area. Therefore, the resist pattern 53A is allowed to remain such that the resist pattern 53A has an opening in the certain area which is located inside the scribe line area SL and which includes the mark portions 45XA, 45YA1 and 45YB1 (see FIG. 4D). Further, etching is performed for the neutral layer 55 with the resist pattern 53A as the mask, and the resist is removed (Step 120). With this, the neutral layer 55 is removed from the openings 45XAa, 45YA1a of the mark portions 45XA, 45YA1 and 45YB1, while the neutral layer 55 is allowed to remain between the guide patterns 52a and between the guide patterns 52c in the shot area SA, as depicted in FIG. 5B.

Then, the wafer W in which the neutral layer 55 has been removed from the mark portions of the scribe line area SL is transported to the polymer processing apparatus 500, and a polymer layer 56 containing a block copolymer (BCP) is formed (applied) on the wafer W (the wafer W is coated with the polymer layer 56 containing the BCP) by, for example, the spin coating (Step 122). In the embodiment, as an example, diblock copolymer (PS-b-PMMA) of polystyrene (PS) and polymethyl methacrylate (PMMA) is used as the block copolymer. Further, although the polymer layer 56 is the block copolymer itself, the polymer layer 56 may contain a solvent for increasing the coating property and/or an additive for facilitating the self-assembly, etc. By the spin coating, the polymer layer 56 is formed only at a certain portion of the wafer W at which the neutral layer 55 is present, and at another portion in the vicinity of the certain portion, but the polymer layer 56 is not formed in the mark portions (openings 45XAa, 45YA1a) (see FIG. 4E).

Then, the wafer W having the polymer layer 56 formed thereon is transported to the annealing apparatus 600, and annealing (for example, thermal annealing) is performed for the polymer layer 56 to thereby allow the polymer layer 56 to separate into two kinds of domains by the directed self-assembly (DSA) (Step 124). By the directed self-assembly in this step, on the upper surfaces of the plurality of liquid-repellent guide patterns 52a of the device pattern, the polymer layer 56 undergoes the phase separation into a liquid-repellent domain 56B and a lyophilic domain 56A such that the polymer layer 56 becomes the liquid-repellent domain 56B on each of the guide patterns 52a and that the lyophilic domain 56A and the liquid-repellent domain 56B are periodically arranged between the guide patterns 52a. In the embodiment, the lyophilic domain 56A is composed of PMMA (polymethyl methacrylate) and the liquid-repellent second domain 56B is composed of PS (polystyrene).

Figure 4F:
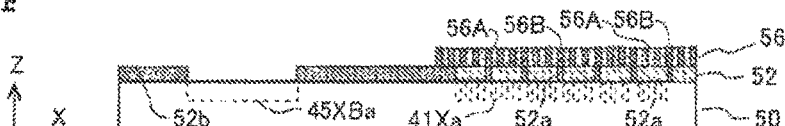
Figure 4G:
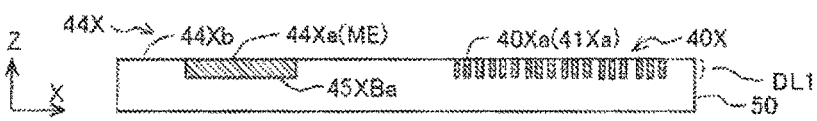

Afterwards, the wafer W is transported to the etching apparatus 400 and, for example, oxygen plasma etching is performed for the wafer W so as to selectively remove the lyophilic domains 56A among the domains 56A and 56B formed on the wafer W (Step 126). Further, etching is performed for the neutral layer 55, with the domains 56B allowed to remain as a mask, and the domains 56B are removed (Step 128); and the etching is performed for the first device layer DL1 of the wafer W, with the etched neutral layer 55 and the liquid-repellent layer 52 in the mark portions (openings 45XAa, 45YA1a) as the mask (first half of Step 130). As depicted in FIG. 4F, a plurality of minute recessed portions 41Xa are formed in the first device layer DL1 at areas corresponding to the plurality of domains 56A, respectively and recessed portions 45XBa are formed in the mark portion, wherein the recessed portions 45XBa become the recessed areas 44Xa of the wafer mark 44X of FIG. 2B. Similarly, the recessed areas 44Ya (not depicted in FIG. 4F) of the wafer marks 44YA, 44YB are also formed. Then, the wafer W is transported to the thin film forming apparatus 300, and by embedding a metal (for example, copper) ME into the recessed portions 41Xa and the recessed areas 44Xa, etc. of the first device layer DL1 of the wafer W as depicted in FIG. 4G, the wafer marks 44X, 44YA and 44YB and the L & S patterns 40X and 40Y of FIG. 2B are formed (second half of Step 130).

Then, in a case that a second device layer is formed on the first device layer DL1 of the wafer W in Step 132 (Next Step), a thin film is formed on the first device layer DL1 of the wafer W, resist is coated on the thin film, and the wafer W is loaded onto the exposure apparatus 100. Then, the wafer alignment system ALS is used to thereby detect the positions of the wafer marks WM (44X, 44YA, 44YB) provided adjacent to a predetermined plurality of shot areas SA of wafer W of FIG. 2A, and the alignment of the wafer W is performed by using the result of the detection. Further, by exposing each of the shot areas SA of the wafer W with an image of a reticle pattern for the second device layer and by performing a post processing therefor, the pattern of the second device layer is formed.

According to the pattern forming method of the embodiment as described above, the directed self-assembly of the polymer layer 56 containing the block copolymer is used so as to form the L & S patterns 40X and 40Y, each having the structure more minute (finer) than the resolution limit of the liquid immersion lithography, in each of the shot areas SA of wafer W, but at the same time, the neutral layer 55 is removed from the mark formation area of the scribe line area(s) SL so that the polymer layer 56 does not remain in the mark formation area. Accordingly, the wafer mark can be formed with high precision in the mark formation area, in a similar manner as in a case that no directed self-assembly is used.

The effect, etc. of the embodiment are as follows. The mark forming method with the pattern forming system of the embodiment includes: Step 114 of forming the neutral layer 55 (intermediate layer), to which the polymer layer 56 containing the block copolymer is adherable (attachable), on the device layer DL1 (layer to be processed) of the wafer W, the device layer DL1 including the shot areas SA and the scribe line areas SL; Steps 118 and 120 of removing a portion, of the neutral layer 55, formed in the mark portions of the scribe line areas SL; Steps 108 to 112 of exposing the scribe line area SL with the mark image 45XP, and of forming the mark portion 45XA including the openings 45XAa (recessed portions) based on the mark image 45XP; and Step 120 of applying the polymer layer 56 containing the block copolymer on the device layer DL1 of the wafer W.

According to the mark forming method, the circuit pattern having the period more minute than the resolution limit of the liquid immersion lithography can be formed by using the self-assembly of the polymer layer 56 containing the block copolymer. Further, since the neutral layer 55 is removed from the wafer mark formation area of the scribe line area SL of the device layer DL1 such that the polymer layer 56 is not formed in the wafer mark formation area, the wafer marks 44X, 44YA and 44YB having the conventional shape can be formed at the same time with the formation of the minute circuit pattern. Accordingly, the device layer DL1 and the device layer formed on the device layer DL1 can be positioned with high precision by using the wafer marks.

Note that the shapes of the wafer marks 44X, 44YA and 44YB are arbitrary. For example, the X-axis wafer mark 44X and the Y-axis wafer marks 44YA and 44YB may be formed in different device layers, respectively, of the wafer W.

Second Embodiment

Figure 6A:
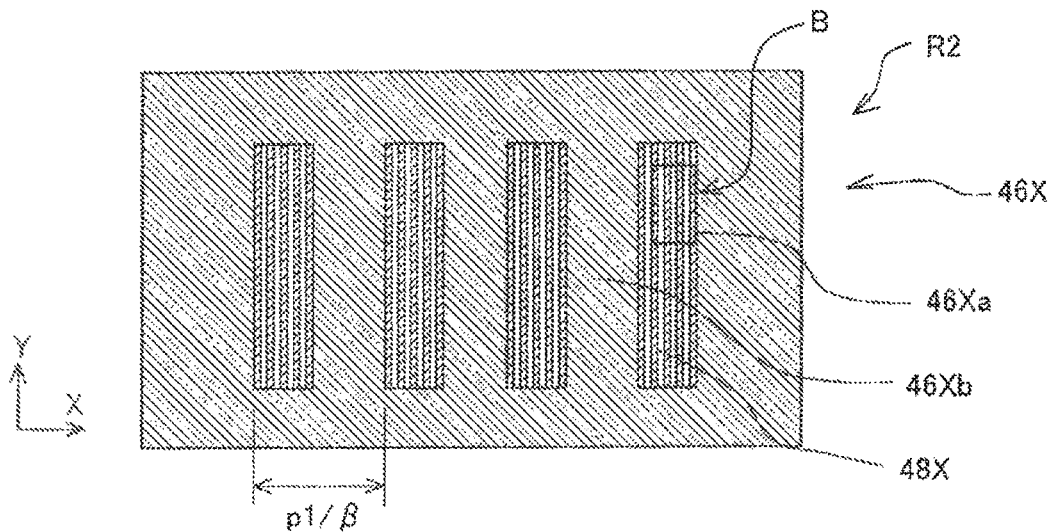
FIG. 6A is an enlarged plane view depicting a portion of a mark pattern of a reticle of a second embodiment.
Figure 6B:
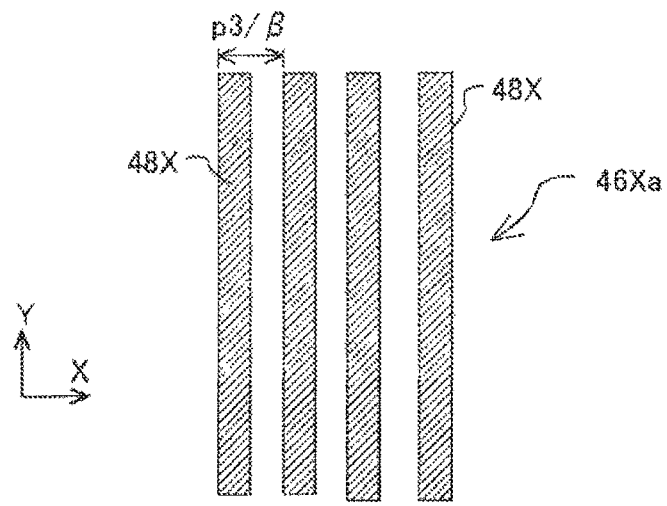
FIG. 6B is an enlarged view depicting a pattern of a transparent area in FIG. 6A.

An explanation will be given about a second embodiment, with reference to FIGS. 6A to 10. Also in the second embodiment, a device pattern and a wafer mark are formed in a device layer of the wafer by using the pattern forming system of FIG. 1A while employing the directed self-assembly (DSA) of the block copolymer (BCP). Although the shot arrangement of a wafer (hereinafter referred to as "wafer W1") of the second embodiment is similar to the shot arrangement of the wafer W of FIG. 2A, the second embodiment forms a minute structure in which a plurality of line patterns having a minute line width are arranged in each of the recessed area 44Xa of the X-axis wafer mark 44X. In the following, an explanation will be given about the X-axis wafer mark 44X, but the Y-axis wafer marks 44YA and 44YB can be formed in a similar manner as the formation of the X-axis wafer mark 44X. Further, the mark forming method of the second embodiment is a method obtained by omitting the operations of Steps 116 to 120 (operations for removing the neutral layer 55 from the area in which the wafer mark is formed) from the mark forming method of FIG. 3. Furthermore, in the second embodiment, in Step 108, it is exposed an image of a pattern, of a reticle R2, in which a mark pattern 46X of FIG. 6A is formed, rather than performing the exposure with the pattern of the reticle R. A device pattern (not depicted in the drawings) of the reticle R2 is same as that of the reticle R.

As depicted in FIG. 6A, a pattern area of the reticle R2 corresponding to each of the scribe line areas SL is formed with the X-axis mark pattern 46X that is the original of the wafer mark. The mark pattern 46X is constructed by arranging a partially transparent area 46Xa corresponding to the recessed area 44Xa of FIG. 2B and a light-shielding area 46Xb corresponding to the projected area 44Xb of FIG. 2B in the X direction at a period $p1/\beta$ ($\beta$ is the projection magnification). The width of the partially transparent area 46Xa and the width of the light-shielding area 46Xb are substantially same. For the convenience of the following explanation, an image of the reticle pattern by the projection optical system PL is an erected image.

A plurality of line patterns 48X is formed in the partially transparent area 46Xa. The line patterns 48X are each formed of a light-shielding film elongated in the Y direction while having a light-transparent portion as the background thereof, and are arranged in the X direction at a period p3/β (see FIG. 6B which is an enlarged view of a "B" portion of FIG. 6A). The line width of the line pattern 48X is ½ times the period p3/β corresponding thereto. In the second embodiment, the period p3/β is substantially same as the resolution limit on the object plane side of the projection optical system PL of the exposure apparatus 100 (resolution limit of the liquid immersion lithography using the wavelength of 193 nm). It is allowable, however, that the period p3/β is about slightly greater than the resolution limit. Accordingly, the image of the mark pattern 46X of the reticle R2 is exposed to, for example, a positive resist layer arranged in the scribe line area SL and arranged on the liquid-repellent layer 52 of the wafer W1, by the exposure apparatus 100 with high precision (Step 108).

Figure 7A:
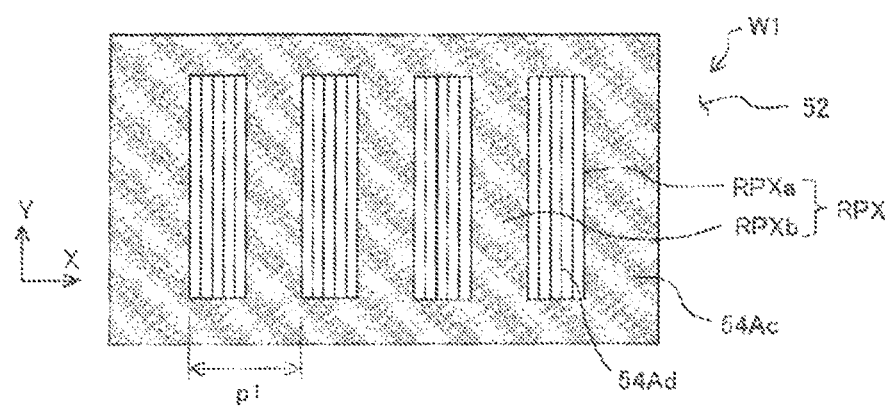
FIG. 7A is an enlarged plane view depicting a portion of a resist pattern of the second embodiment.
Figure 7B:
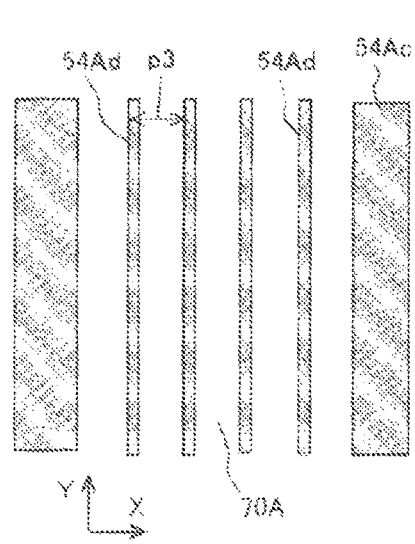
FIG. 7B is an enlarged view depicting a recessed area in FIG. 7A.
Figure 7C:
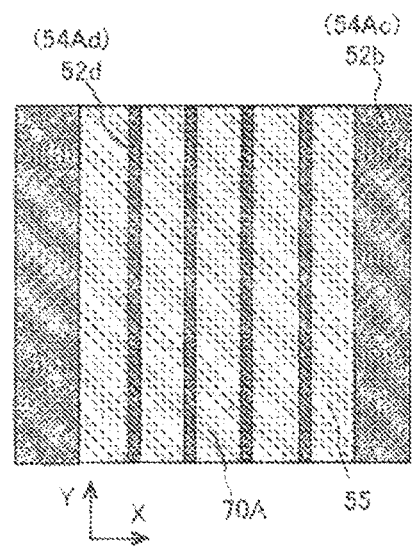
FIG. 7C is an enlarged view depicting a portion of a liquid-repellent layer which has been patterned.
Figure 8A:
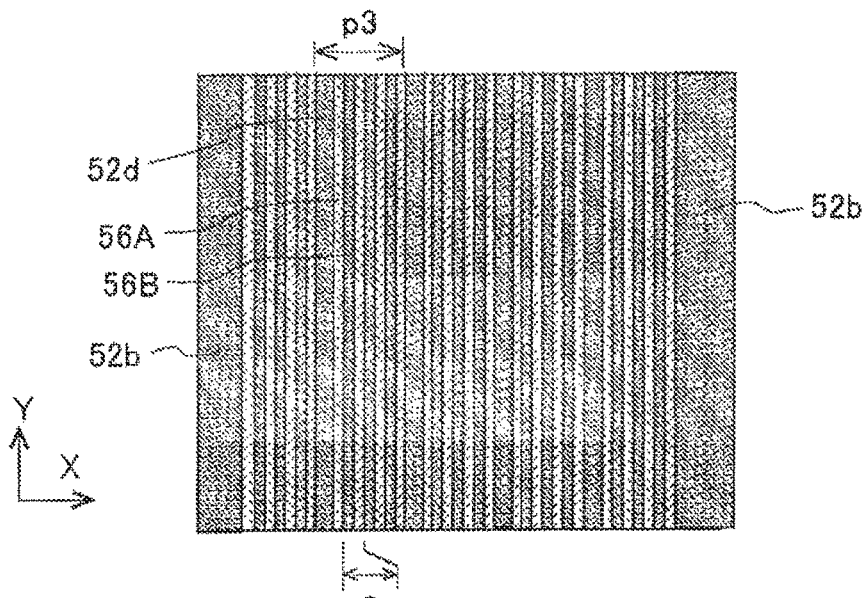
FIG. 8A is an enlarged plane view depicting a polymer layer separated into two kinds of domains.

FIG. 7A depicts an X-axis resist mark RPX which is composed of a resist pattern that is formed on the liquid-repellent layer 52 of the wafer W1 after the exposure of the image of the mark pattern 46X of the reticle R2 of FIG. 6A to the resist layer, the development and the slimming therefor. In FIG. 7A, the resist mark RPX is constructed by arranging a line-group area RPXa corresponding to the partially transparent area 46Xa of the reticle R2 of FIG. 6A and a projected area RPXb corresponding to the light-shielding area 46Xb of the reticle R2 of FIG. 6A in the X direction at the period p1. Further, FIG. 7B is an enlarged view depicting one piece of the line-group areas PRXa of FIG. 7A, and FIGS. 7C and 8A are each an enlarged plain view depicting a portion corresponding to a portion in FIG. 7B.

A resist pattern 54Ac is formed in the projected area RPXb (here, the projected area RPXb is also an area surrounding the line-group area RPXa). Further, in the line-group area PRXa, a plurality of patterns 54Ad having a projected and linear shape (hereinafter referred to as "guide patterns 54Ad") each of which is elongated in the Y direction are formed in the X direction at a period p3 while sandwiching a recessed portion 70A therebetween. The line width of each of the guide patterns 54Ad is, for example, about one severalth to about one several tenths of the period p3 (here, a period converted score of the resolution limit of the liquid immersion lithography using the wavelength of 193 nm) (see FIG. 7B). Further, by performing etching for the liquid-repellent layer 52 of the wafer W1 in the subsequent step 112 with the resist mark RPX as the mask, a plurality of projected liner patterns 52d (hereinafter referred to as "guide patterns 52d") each elongated in the Y direction are formed in the liquid-repellent layer 52 at portions corresponding to each of the line-group areas RPXa, while having the remaining-film portion 52b located at the same position as that of the resist pattern 54Ac as the background thereof, as depicted in FIG. 7C. The guide patterns 52d are arranged in the X direction at the period p3 while sandwiching the recessed portions 70A therebetween. Afterwards, in Step 114, the neutral layer 55 is formed in the recessed portions 70A between the guide patterns 52d of the liquid-repellent layer 52.

Figure 8B:
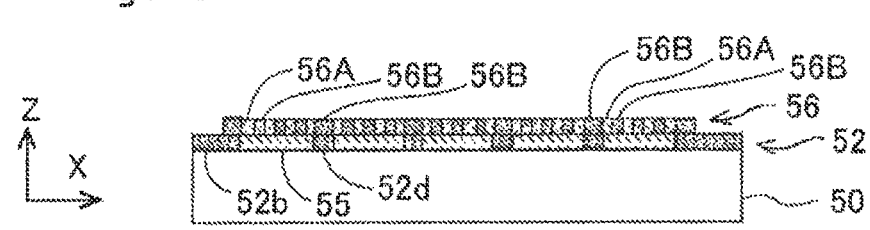
FIGS. 8B, 8C and 8D are cross-sectional views each depicting a wafer of FIG. 8A gradually changing during a production step.

In the second embodiment, the processing proceeds to Step 122 after Step 114, and the polymer layer 56 including the block copolymer (see FIG. 8B) is formed on the wafer W1 on the area at which the neutral layer 55 is formed. Further, by performing the annealing of the polymer layer 56 (Step 124), the polymer layer 56 is separated into two kinds of domains by the directed self-assembly (DSA), as depicted in FIGS. 8A and 8B. In this case, above the plurality of liquid-repellent guide patterns 52d for the wafer mark, the polymer layer 56 undergoes the phase separation into a liquid-repellent domain 56B and a lyophilic domain 56A such that the polymer layer 56 becomes the liquid-repellent domain 56B on each of the guide patterns 52d and that the lyophilic domain 56A and the liquid-repellent domain 56B are periodically arranged between the guide patterns 52d in the X direction. In the second embodiment, the lyophilic domain 56A is composed of PMMA (polymethyl methacrylate) and the liquid-repellent domain 56B is composed of PS (polystyrene).

Figure 8C:
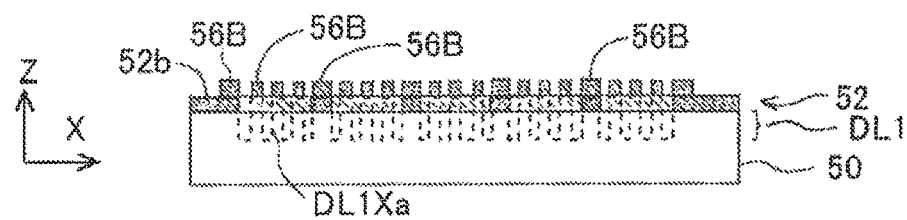
Figure 8D:
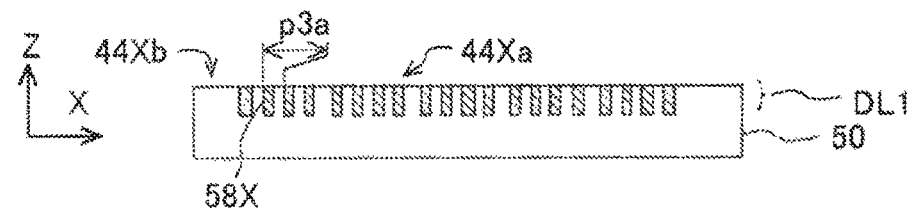

Afterward, for example, oxygen plasma etching is performed for the wafer W1 so as to selectively remove the lyophilic domains 56A among the domains 56A, 56B formed on the wafer W1 (Step 126). Further, etching is performed for the neutral layer 55, with the domains 56B allowed to remain as the mask (Step 128), and the etching is performed for the device layer (which is designated as "first device layer DL1") of the wafer W1, with the etched neutral layer 55 as the mask (first half of Step 130). As depicted in FIG. 8C, a plurality of minute recessed portions DL1Xa are formed in the first device layer DL1 at areas, in the scribe line areas SL, corresponding to the plurality of domains 56A, respectively; and by embedding a metal (for example, copper) into each of the recessed portion DL1Xa so as to form a line pattern 58X, a recessed area 44Xa including a plurality of pieces of the line pattern 58X, and a flat-shaped projected area 44Xb as depicted in FIG. 8D is formed. A period p3a of the line patterns 58X is, for example, about one severalth to about one several tenths of the period p3 depicted in FIG. 7B.

By the steps as described above, as depicted in FIG. 9, a X-axis wafer mark 44X, in which the recessed area 44Xa having the plurality of metallic line patterns 58X arranged therein in the X direction substantially at the period p3a (see FIG. 8D) and the projected area 44Xb are arranged in the X direction at the period p1, is formed in the scribe line area SL of the device layer DL1 of the wafer W1.

In the second embodiment, provided that a period converted score of the resolution limit (size limit which can be optically detected by using a detection light from the visible range to the near-infrared range) of the wafer alignment system ALS provided with the exposure apparatus 100 is "Re(det)" and a period converted score of the resolution limit of the liquid immersion lithography using the wavelength of 193 nm is "Re(exp)", then the period p1 of the recessed area 44Xa and the projected area 44Xb of the wafer mark 44X, the resolution limit Re(det), the resolution limit Re(exp) and the period p3a of the line patterns 58X constructing the recessed area 44Xa have the following relationship (1):

$$p1 \geq Re(det) > Re(exp) > p3a \qquad (1)$$

Figure 9:
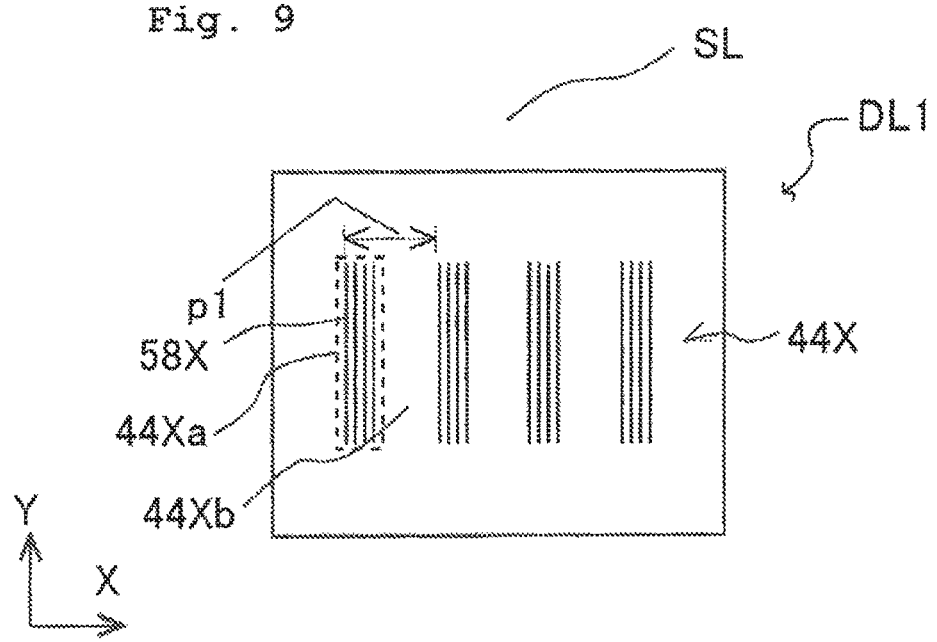
FIG. 9 is an enlarged plane view depicting a wafer mark formed in the second embodiment.

Accordingly, the period p3a of the line pattern 58X is smaller than the resolution limit Re(det) of the wafer alignment system ALS. Therefore, in a case that an image of the wafer mark 44X of FIG. 9 is taken by the wafer alignment system ALS, individual images of the plurality of line patterns 58X are not formed. However, since the average reflectivity is different between the areas 44Xa and 44Xb, an image of the X-axis wafer mark 44X having the period p1 can be detected. Accordingly, even if any structure which cannot be optically detected is included in the wafer mark 44X, the position of the wafer mark 44X can be detected by the wafer alignment system ALS with high precision.

Figure 10:
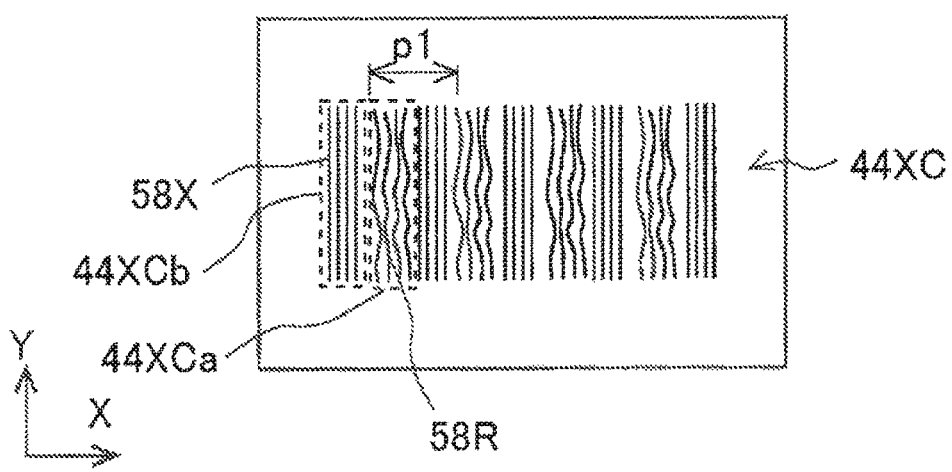
FIG. 10 is an enlarged plane view depicting a wafer mark of a comparative example.

In contrast, as indicated by a wafer mark 44XC of a comparative example depicted in FIG. 10 in which a projected area 44XCb and a recessed area 44XCa are arranged in the X direction at the period p1, there is presumed a case in which a polymer layer containing a block copolymer is allowed to undergo the self-assembly at the projected area 44XCb with a guide pattern in a similar manner as in the embodiment. In this case, the plurality of line patterns 58X are arranged in the projected area 44XCb at a fine period, in a similar manner in the embodiment. Further, the polymer layer in the recessed area 44XCa also undergo relatively weak directed self-assembly, and thus, for example, a plurality of such line patterns 58R that meander substantially in the Y direction are arranged in the X direction in the recessed area 44XCa. Since the difference in reflectivity is small between the projected area 44XCb and the recessed area 44XCa as a result, there is a fear that the detection of the wafer mark 44XC by the wafer alignment system ALS might become difficult.

As described above, the mark forming method of the second embodiment includes: Steps 104 to 112 of exposing an image of the mark pattern 46X on the device layer DL1 of the wafer W1, and of forming the resist mark RPX including the projected areas RPXb (projected line portions) (or a mark including the remaining-film portions 52b (projected line portions), of the liquid-repellent layer 52, corresponding to the resist mark RPX), based on the image of the mark pattern 46X; Step 122 of applying the polymer layer 56 containing the block copolymer on a portion of the area of the wafer W1, the portion being located in the area formed with the resist mark RPX (or the mark of the liquid-repellent layer 52 corresponding to the resist mark RPX) and being different from the projected areas RPXb (or being different from the remaining-film portions 52b); Step 124 of allowing the polymer layer 56 to form the self-assembly area (domains 56A, 56B); Step 126 of selectively removing a portion (domains 56A) of the self-assembly area; and Steps 128 and 130 of processing the device layer DL1 of the wafer W1 by using the self-assembly area from which the portion of the self-assembly area has been selectively removed.

According to the second embodiment, it is possible to form the wafer mark concurrently with the formation of the circuit pattern by using the self-assembly of the block copolymer, and, since the self-assembly of the block copolymer occurs at a portion, of the wafer mark, which is different from the projected area, it is possible to optically detect the formed wafer mark with high precision.

Note that in the second embodiment, the following modifications can be possible.

In the second embodiment, the guide patterns 54Ad are periodically formed in the line-group area RPXa of the resist pattern of FIG. 7A, in the direction (X direction) same as the periodic direction of the mark. However, the illumination condition of the exposure apparatus 100 is changed depending on the configuration of the device pattern for the device layer to be used. Accordingly, it is allowable to form, in the line-group area RPXa, a guide pattern extending in the X direction and arranged periodically in a direction orthogonal to the periodic direction of the mark, depending on the illumination condition. Further, it is also allowable to omit the guide pattern.

Figure 11A:
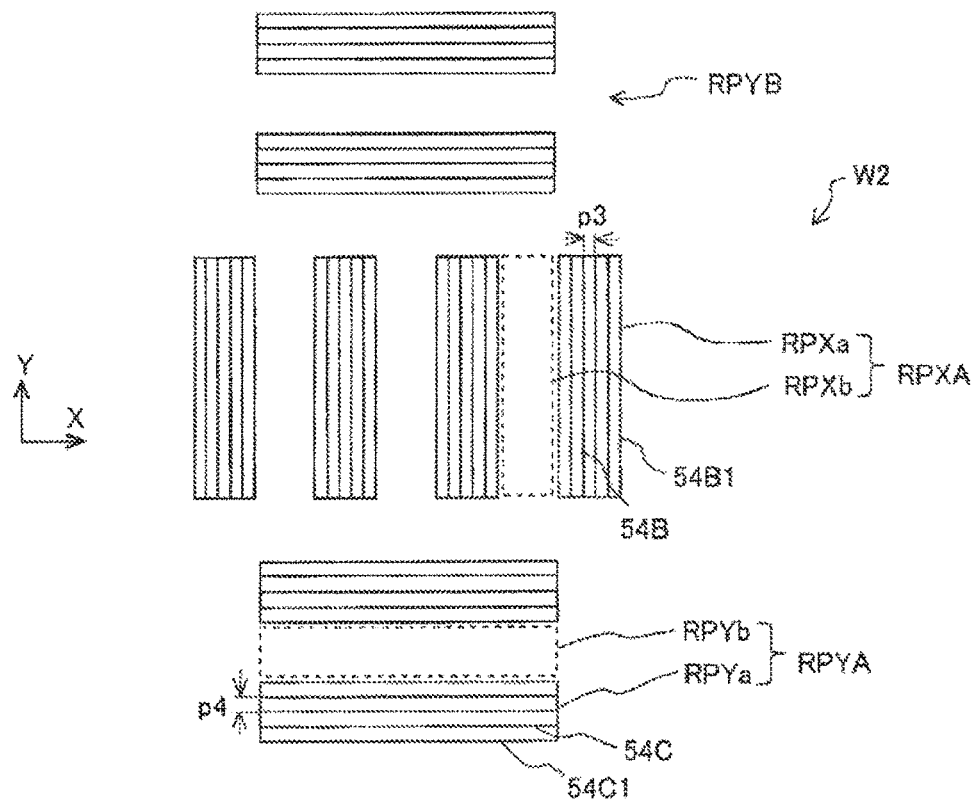
FIG. 11A is an enlarged plane view depicting a resist mark for a wafer mark of a first modification.

Further, as depicted by an X-axis resist mark RPXA and Y-axis resist marks RPYA and RPYB formed in a wafer W2 of a first modification in FIG. 11A, it is allowable to set a value of a period p3 at which guide patterns 54B, of the X-axis resist mark RPXA, are arranged in the X direction in a line-group area RPXa (recessed area) surrounded by a frame member 54B1 to be different from a value of a period p4 at which guide patterns 54C, of each of the Y-axis resist marks RPYA and RPXB, are arranged in the Y direction in a line-group area RPYa (recessed area) surrounded by a frame member 54C1. In this case, projected areas RPXb between the line-group areas RPXa and projected areas RPYb between the line-group areas RPYa are flat resist portions. In a case that the fineness in the X direction of a device pattern, corresponding to the mark pattern, formed in a device layer is finer (more minute) than the fineness in the Y direction of the device pattern, the first modification may be used so as to form the Y-axis guide pattern 54C with high precision. The behavior of the self-assembly of the block copolymer thereafter is similar to that in the embodiment.

Figure 11B:
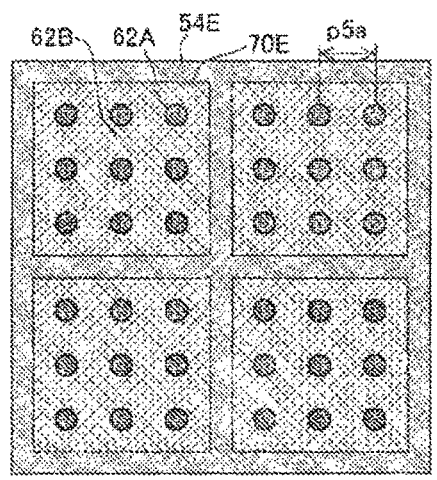
FIG. 11B is a partially enlarged view depicting a polymer layer separated into hole pattern-shaped domains.

Further, in a case that the device pattern, corresponding to the mark pattern, in the device layer has a large number of minute holes (or via, etc.) formed by the self-assembly of the block copolymer, it is allowable to form, in the line-group areas RPXa and RPYa (recessed portions), a rectangular, grid-shaped guide pattern 54E of which portion is depicted in FIG. 11B. In this case, for example, minute, columnar-shaped lyophilic domains 62A surrounded by a liquid-repellent domain 62B are formed in a recessed portion 70E inside the guide pattern 54E, at a period p5a, etc., which is smaller than the period p3, by the self-assembly of the block copolymer. Further, by selectively removing the domains 62A, by performing etching for the liquid-repellent layer 52 and the device layer, and by embedding a metal, etc. to the circular-shaped recessed portions, it is possible to form a wafer mark having a large number of minute hole patterns formed in the recessed areas. This wafer mark also can be detected by the wafer alignment system ALS.

Next, as indicated by a wafer W3 of a second modification of FIG. 12A, there is presumed a case that the minutest device pattern in a first device layer DL1 of the wafer W3 is the X-axis L & S pattern 40X of FIG. 2B, and that the minutest device pattern in a second device layer DL2, different from the first device layer DL1 of the wafer W3 (for example, a second device layer DL2 provided on an insulating layer 60A arranged on the first device layer DL1) is the Y-axis L & S pattern 40Y of FIG. 2B. Further, in this presumed case, a dipole illumination apart in the X direction is used when exposing the pattern of the first device layer DL1 so as to enhance the resolution in the X direction, and a dipole illumination apart in the Y direction is used when exposing the pattern of the second device layer DL2 so as to enhance the resolution in the Y direction.

In this case, at the stage of resist pattern, a resist mark RPX is formed in the scribe line area (mark formation area) of the first device layer DL1. The resist mark PRX is obtained by arranging, in the X direction, a plurality of line-group areas RPXa (recessed areas), each having a configuration in which guide patterns 54B elongated in the Y direction are periodically arranged in the X direction, in a state that projected areas RPXb are intervened between the line-group areas RPXa, as depicted in FIG. 12B. An image of the pattern of a reticle based on which the guide patterns 54B are formed is exposed by a dipole illumination in the X direction with high precision. After this, the directed self-assembly of the polymer layer containing the block copolymer is used, in a similar manner as in the embodiment described above, so as to form, for example, a plurality of line patterns arranged in the X direction at portions of the device layer corresponding to each line-group area RPXa, thereby forming the wafer mark 44X.

On the other hand, at the stage of resist pattern, resist marks RPYA and RPYB are formed in the scribe line area of the second device layer DL2. Each of the resist marks RPYA and RPYB is obtained by arranging, in the Y direction, a plurality of line-group areas RPYa, each having a configuration in which guide patterns 54C elongated in the X direction are periodically arranged in the Y direction, in a state that projected areas RPYb are intervened between the line group areas RPYa, as depicted in FIG. 12C. An image of the pattern of a reticle based on which the guide patterns 54C are formed is exposed by a dipole illumination in the Y direction with high precision. After this, the directed self-assembly of the polymer layer containing the block copolymer is used, in a similar manner as in the embodiment described above, so as to form, for example, a plurality of line patterns arranged in the Y direction at portions of the device layer corresponding to each line-group areas RPYa, thereby forming each of the wafer marks 44YA and 44YB. Afterwards, when performing the alignment for the wafer W3, it is possible to perform the alignment of the wafer W3 in the X and Y directions by detecting the X-axis wafer mark of the device layer DL1 and the Y-axis wafer mark of the device layer DL2 with the wafer alignment system ALS.

Figure 13:
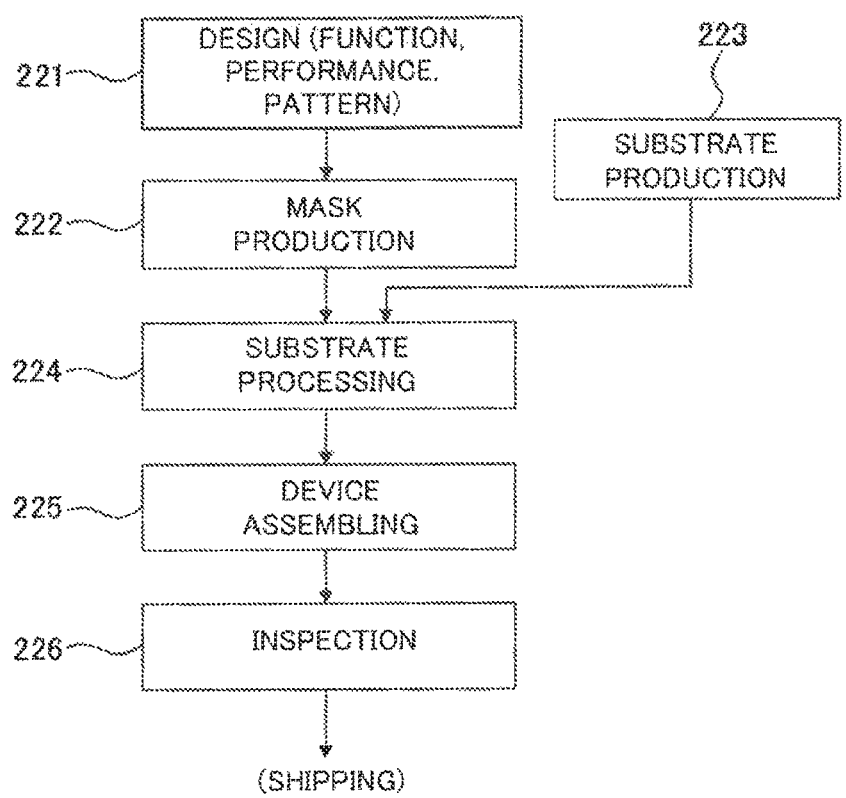
FIG. 13 is a flow chart indicating an example of steps for producing an electronic device.

Next, in a case that a semiconductor device (electronic device) such as a SRAM is produced by using the pattern forming method of the respective embodiments described above, the semiconductor device is produced, as depicted in FIG. 13, by performing a step 221 of designing the function and the performance of the semiconductor device; a step 222 of producing a mask (reticle) based on the designing step; a step 223 of producing a substrate (or a base material for a wafer) for the semiconductor device; a substrate-processing step 224; a step 225 of assembling the device (including processing processes such as a dicing step, a bonding step, and a packaging step); an inspection step 226; and the like. Further, the substrate-processing step 224 includes the pattern forming method of the embodiments as described above, and the pattern forming method includes a step of exposing the substrate with a pattern of the reticle by an exposure apparatus, a step of developing the exposed substrate, a step of heating (curing) and etching the developed substrate, etc.

In other words, the method for producing the device includes the substrate-processing step 224, and the substrate-processing step 224 includes a step of forming the device pattern and the wafer mark on the substrate by using the pattern forming method of any one of the respective embodiments.

According to the method for producing the device, it is possible to produce a semiconductor device including a circuit pattern finer (more minute) than the resolution limit of the exposure apparatus with high overlay accuracy and high precision, by using the exposure apparatus.

Note that devices as the object to be produced in the respective embodiments may be any semiconductor device different from the SRAM, such as DRAM (dynamic random-access memory), CPU (central processing unit), DSP (digital signal processor), etc. Further, when producing electronic devices (microdevices) different from the semiconductor devices, such as imaging elements, MEMS (Microelectromechanical Systems), etc., the pattern forming method of the respective embodiments as described above is applicable.

Further, in the above-described embodiments, it is allowable to use a dry-type exposure apparatus different from the exposure apparatus of the liquid immersion type. Furthermore, other than the exposure apparatus using the ultraviolet light as the exposure light, it is also allowable to use an EUV exposure apparatus employing an EUV light (Extreme Ultraviolet Light) of which wavelength is about several nm to about several tens of nm as the exposure light, or an electron beam-exposure apparatus employing an electron beam as the exposure light, etc.

Furthermore, in the above-described embodiments, diblock copolymer composed of (Ps-b-PMMA) is used as the block copolymer. Other than this, substances usable as the block copolymer include, for example, poly(styrene-b-vinylpyridine), poly(styrene-b-butadiene), poly(styrene-b-isoprene), poly(styrene-b-methyl methacrylate), poly(styrene-b-aromatic alkenyl), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), or poly(methyl methacrylate-b-dimethylsiloxane); or diblock or triblock copolymers, etc., including a combination including at least one of the above-described block copolymers; and the like. Further, it is also possible to use a random copolymer as the block copolymer.

It is preferred that the block copolymer has overall molecular weight or polydispersity for making it possible to perform any further processing.

Further, coating of the polymer layer containing the block copolymer can be performed also by a solvent casting method wherein the coating is performed with a liquid in which the polymer layer is dissolved in a solvent, and then, for example, the solvent is allowed to volatilize. In this case, the usable solvent changes depending on the components of the block copolymer, and in a case that additives are used, the usable solvent changes depending on the solubility of various kinds of the additives. The exemplary casting solvents for these components and additives include propylene glycol monomethyl ether acetate (PGMEA), ethoxy ethyl propionate, anisole, ethyl lactate, 2-heptanone, cyclohexanone, amyl acetate, γ-butyrolactone (GBL), toluene, etc.

Further, additives which can be added to the polymer layer containing the block copolymer can be selected from the group including: an additional polymer (including a homopolymer, a star polymer and copolymer, a hyper-branched polymer, a block copolymer, a graft copolymer, a hyper-branched copolymer, a random copolymer, a cross-linked polymer, and an inorganic material-containing polymer); a small molecule; a nano-particle; a metallic compound; an inorganic material-containing molecule; a surfactant; a photo acid generating agent; a thermal acid generating agent; a basic quencher; a curing agent; a cross-linking agent; a chain extending agent; and a combination including at least one of the above-described substances. Here, one or plurality of additives associate(s) with the block copolymer to form a portion of one or plurality of self-assembly domains.

Note that the present teaching is not limited to the embodiments described above, and may be embodied in other various forms or configurations within a scope without deviating from the gist or essential characteristics of the present teaching.

What is claimed is:
1. A mark forming method comprising:
   forming, on a substrate, a plurality of first patterns and a plurality of second patterns; applying a block copolymer on the substrate after the plurality of first patterns and the plurality of second patterns have been formed;
   applying a self-assembly treatment to the block copolymer applied on the substrate;

forming a first mark having a first shape between adjacent patterns of the plurality of first patterns after the self-assembly treatment has been applied to the block copolymer; and forming a second mark having a second shape different from the first shape between adjacent patterns of the plurality of second patterns after the self-assembly treatment has been applied to the block copolymer.

2. The mark forming method according to claim 1, wherein the block-copolymer is applied between two patterns of the plurality of first patterns and two patterns of the plurality of second patterns.

3. The mark forming method according to claim 1, wherein a first recess is formed between two patterns of the plurality of first patterns and a second recess is formed between two patterns of the plurality of second patterns, and the block-copolymer is applied to the first and second recesses.

4. The mark forming method according to claim 1, wherein the plurality of first patterns and the plurality of second patterns are planer pre-patterns.

5. The mark forming method according to claim 1, wherein the first and second marks are formed by using a part of the block-copolymer remained without being removed.

6. The mark forming method according to claim 1, wherein the first and second marks are formed in a scribe line of the substrate.

7. The mark forming method according to claim 1, wherein a periodic direction of the plurality of first patterns and a periodic direction of the plurality of second patterns are different from each other.

8. The mark forming method according to claim 7, wherein the periodic direction of the plurality of first patterns and the periodic direction of the plurality of second patterns are orthogonal to each other.

9. A mark forming method comprising:
forming, on a substrate, a plurality of first patterns and a plurality of second patterns;
applying a block copolymer on the substrate after the plurality of first patterns and the plurality of second patterns have been formed;
applying an annealing to the block copolymer applied on the substrate;
forming a first mark having a first shape between adjacent patterns of the plurality of first patterns after the annealing has been applied to the block copolymer; and
forming a second mark having a second shape different from the first shape between adjacent patterns of the plurality of second patterns after the annealing has been applied to the block copolymer.

10. A device manufacturing method comprising:
forming an alignment mark on a substrate by using the mark forming method as defined in claim 1; and
performing an alignment by using the alignment mark, and then, exposing the substrate.

11. The mark forming method according to claim 9, wherein the block-copolymer is applied between two patterns of the plurality of first patterns and two patterns of the plurality of second patterns.

12. The mark forming method according to claim 9, wherein a first recess is formed between two patterns of the plurality of first patterns and a second recess is formed between two patterns of the plurality of second patterns, and the block-copolymer is applied to the first and second recesses.

13. The mark forming method according to claim 9, wherein the plurality of first patterns and the plurality of second patterns are planer pre-patterns.

14. The mark forming method according to claim 9, wherein the first and second marks are formed in a scribe line of the substrate.

15. The mark forming method according to claim 9, wherein a periodic direction of the plurality of first patterns and a periodic direction of the plurality of second patterns are different from each other.

16. The mark forming method according to claim 15, wherein the periodic direction of the plurality of first patterns and the periodic direction of the plurality of second patterns are orthogonal to each other.

17. A device manufacturing method comprising:
forming an alignment mark on a substrate by using the mark forming method as defined in claim 9; and
performing an alignment by using the alignment mark, and then, exposing the substrate.

* * * * *